(12) United States Patent
Martens et al.

(10) Patent No.: US 8,718,586 B2
(45) Date of Patent: May 6, 2014

(54) APPARATUS FOR ENHANCING THE DYNAMIC RANGE OF SHOCKLINE-BASED SAMPLING RECEIVERS

(75) Inventors: Jon Martens, San Jose, CA (US); Karam Michael Noujeim, Sunnyvale, CA (US)

(73) Assignee: Anritsu Company, Morgan Hill, CA (US)

( * ) Notice: Subject to any disclaimer, the term of this patent is extended or adjusted under 35 U.S.C. 154(b) by 932 days.

(21) Appl. No.: 12/495,280

(22) Filed: Jun. 30, 2009

(65) Prior Publication Data

US 2010/0330944 A1 Dec. 30, 2010

(51) Int. Cl.
H04B 7/00 (2006.01)

(52) U.S. Cl.
USPC .................. 455/258; 455/67.11; 324/650

(58) Field of Classification Search
USPC .......................................... 455/258; 324/650
See application file for complete search history.

(56) References Cited

U.S. PATENT DOCUMENTS

| | | | | |
|---|---|---|---|---|
| 4,956,568 A * | 9/1990 | Su et al. | ........................ | 327/321 |
| 5,352,994 A * | 10/1994 | Black et al. | ....................... | 333/33 |
| 5,574,374 A * | 11/1996 | Thompson et al. | ........... | 324/338 |
| 5,789,994 A * | 8/1998 | Case et al. | ........................ | 333/20 |
| 6,219,417 B1 * | 4/2001 | Zhou | ............................. | 379/377 |
| 6,320,480 B1 * | 11/2001 | Kintis et al. | .................... | 333/156 |
| 6,331,786 B1 * | 12/2001 | Whitworth et al. | ............. | 326/30 |
| 6,396,338 B1 * | 5/2002 | Huang et al. | .................. | 329/336 |
| 6,577,677 B1 * | 6/2003 | Hara | .............................. | 375/219 |
| 7,423,470 B2 * | 9/2008 | Gunyan et al. | ................ | 327/291 |
| 2002/0074982 A1 * | 6/2002 | Mizuhara et al. | ............. | 323/284 |
| 2002/0126769 A1 * | 9/2002 | Jett et al. | ......................... | 375/316 |
| 2002/0145484 A1 * | 10/2002 | Agoston et al. | ................. | 333/20 |
| 2004/0222800 A1 * | 11/2004 | Noujeim | ........................ | 324/650 |
| 2004/0251983 A1 * | 12/2004 | Hsu et al. | ........................ | 333/32 |
| 2006/0133599 A1 * | 6/2006 | Pagnanelli | ............... | 379/406.08 |
| 2006/0197626 A1 * | 9/2006 | Ehlers et al. | .................... | 333/112 |
| 2007/0273454 A1 * | 11/2007 | Pepper | ............................. | 333/20 |
| 2007/0273457 A1 * | 11/2007 | Mizutani | ........................ | 333/103 |
| 2007/0273458 A1 * | 11/2007 | Pepper et al. | .................. | 333/167 |
| 2008/0246551 A1 * | 10/2008 | Noujeim | ......................... | 333/20 |
| 2009/0115545 A1 * | 5/2009 | Lan et al. | ....................... | 332/109 |

* cited by examiner

*Primary Examiner* — Nay A Maung
*Assistant Examiner* — Erica Fleming-Hall
(74) *Attorney, Agent, or Firm* — Meyer IP Law Group

(57) ABSTRACT

Shockline-based samplers of a vector-network analyzer (VNA) have enhanced dynamic range by using a dynamic bias network applied to the non-linear transmission lines (NLTLs) or shocklines. The bias voltage applied to the NLTL provides direct control over the falling-edge shockline compression, and thus the insertion loss and overall RF bandwidth of the sampler. Alternating between a forward bias voltage to turn off a shockline sampler when it is not needed and thereby reducing spurious generation and improving isolation can be alternatively applied with a reverse bias voltage to turn on the shockline sampler in a normal operation mode. By measuring the shockline output and providing feedback in the reverse-bias mode, the bias voltage can be dynamically adjusted to significantly increase the performance of the NLTL based sampler. In the presence of a strong positive bias voltage, the incoming LO and its harmonics experience large ohmic losses thus preventing gating pulses from forming in the shockline. The ohmic losses enable strong isolation between the LO sampling channels and will increase spectral purity at the VNA test ports.

15 Claims, 5 Drawing Sheets

APPARATUS FOR ENHANCING THE DYNAMIC RANGE OF SHOCKLINE-BASED SAMPLING RECEIVERS

BACKGROUND

1. Technical Field

The present invention relates to apparatus for enhancing the dynamic range of shockline-based sampling receivers.

2. Related Art

Two problems that arise in high frequency Vector Network Analyzers (VNA) that can affect the accuracy of measurements are intermodulation-product generation, created by the down-converters (which may include samplers), and inadequate channel to channel isolation that can limit the VNA's dynamic range. Use of shock-line based samplers in VNA receivers improves performance in both of these (among other) categories but these performance items are still an issue. One example of the use of shockline samplers in a VNA and how they may be further enhanced to increase isolation is described in U.S. Pat. No. 7,088,111 entitled "Enhanced Isolation Between Sampling Channels In A Vector Network Analyzer," by K. Noujeim.

Shockline-based samplers, whether used in a VNA or other receivers to achieve very high frequency operation, have been the subject of other patents and numerous articles. For example, shockline devices for use in samplers are also described in the following: U.S. Pat. No. 6,894,581, entitled "Monolithic nonlinear transmission lines and circuits and sampling circuits with reduced shock-wave-to-surface-wave coupling," by K. Noujeim; U.S. Pat. No. 5,014,018 entitled "Nonlinear transmission line for generation of picosecond electrical transients," to Rodwell, et al.; and U.S. Pat. No. 7,170,362 entitled "Ultrafast sampler with non-parallel shockline," to Agoston, et al.

FIG. 1 shows an RF block of a prior art VNA using shockline-based samplers. Signal generator 110 provides a source signal to power splitter 112 through a source resistance 111. The power splitter 112 splits the source signal into separate signals for driving different test channel and reference channel samplers. In the example shown, the source signal is split into four signals to drive two test channel samplers and two reference channel samplers. The shockline-based samplers use nonlinear transmission lines (NLTLs) 151-154 which can receive a continuous wave (CW) local oscillator (LO) signal from the signal generator through the power splitter. Each NLTL compresses the falling edge of the LO signal creating a series of sharp step-function-like wavefronts, or shocks. The pulse forming network of the sampler can then be used to differentiate these shocks, resulting in electrical pulses that are used as to gate the sampler.

In operation, a VNA sources a sweeping RF signal that can be applied to a device under test (DUT) 180 at ports 182, 184, or both. The DUT causes a transmission signal or reflection signal that is received by one of samplers 161-164 of the VNA. Each sampler is gated by the LO pulses generated by the NLTLs 151-154. An intermediate frequency (IF) signal comprising a series of sampled data is then created and transmitted from each sampler as $IF_1$, $IF_2$, $IF_3$ and $IF_4$ is illustrated in FIG. 1.

As shown in FIG. 1, a NLTL is made up of a high impedance transmission lines loaded periodically with varactor diodes forming a propagation medium whose phase velocity, and therefore time delay, is a function of the instantaneous voltage. Shockline-based samplers are attractive because of features such as ultra-wideband RF bandwidth and frequency scalability when compared with typical samplers that use step-recovery diode (SRD) circuits instead of the shocklines.

A pulse forming network differentiates shocks generated by the shocklines to create electrical pulses forming LO signals that gate a Schottky-based sampler. But the sampler is well known for generating spurious products that result when an RF signal undergoes partial reflection at the sampler's RF port. In a VNA context, these spurious products emerge from the sampler's RF port and make their way to the device under test (DUT) to create measurement errors. The rich harmonic content of a narrow sampling pulse mixes in the diodes of the sampler with these RF signals to generate spurious products. These products proceed through paths in the measurement system and can re-convert to the system IF in another VNA port's receiver. This could lead to an unrealistic measurement due to the conversion of these spurious products creating an IF similar to that produced by the intended signals.

FIG. 2 shows an example of spurious signal generation. As shown in FIG. 2, a LO source signal 201 is provided to a NLTL shockline 202 that provides a pulse signal to pulse forming network 203. A pulse-forming network differentiates the pulse signal to gate a sampler 204, in this example Sampler 2. An RF signal, shown as $f_{RF}$, can be either provided through DUT 205 from another port or reflected from the DUT 205 and received at the RF port of Sampler 2. The reflected RF signal can mix with LO products in Sampler 2, generating a spurious signal, $f_{spur}$, shown as comprising $|mf_{RF} \pm nf_{LO} \pm pf_{IF}|$ where m, n, and p are integers. This spurious signal may then be passed back through the passband of the DUT and be received by a sampler measuring the transmission signal from the DUT, such as Sampler 3. In addition, the spurious signal could move through the LO distribution chain of Sampler 2 manifesting itself as defects in RF-LO isolation, such as along path 186 shown in FIG. 1.

Previous techniques for improving isolation between channels include the use of isolating devices in the sampler's RF path. This could, however, be very expensive in a broadband system and could worsen the overall dynamic range of the system by introducing additional non-idealities, such as noise or compression. In addition, the use of the RF amplifiers could require additional RF-LO isolation in the LO chain itself. In the configuration of FIG. 1, a combination of bandpass filters, reverse isolation elements, and amplifiers are used in one or more stages to increase isolation between channels by limiting RF leakage between channels. Band pass filters 141-144 may be configured to reduce all signals outside a particular frequency band ($f_L$-$f_H$), preventing or reducing RF signals that fall outside of the frequency band from leaking from the RF port of one sampler to another. Isolators 121-124 or amplifiers 131-134 may also be added and configured to allow signals falling inside the frequency band ($f_L$-$f_H$) to travel along only a single direction from power splitter 112 through the band-pass filter and into the nonlinear transmission line. As a result, RF signals falling inside or outside the frequency band and traveling through the power splitter from the RF port of one sampler to the RF port of another sampler will be blocked or greatly reduced. Additionally, amplifiers 186-192 may be added in the RF path to prevent or reduce spurious products from being applied to a DUT and being passed through its passband to the IF of another sampler. Multiple stages of band pass filters, isolators, and amplifiers may be used to reduce signal leakage between channels and achieve similar performance gains.

While adding additional components as shown in FIG. 1 may improve isolation, such systems to improve isolation have drawbacks. Multiple stages of filters, isolators, and amplifiers added to achieve sufficient isolation can significantly increase cost and power consumption, particularly in broadband systems. The addition of isolation components and multiple amplifier stages can further worsen the overall dynamic range of the receiver.

Another technique to increase channel isolation includes the sequential turn-off of the samplers. The sequential turn off allows samplers not being used for that particular measurement to be disabled so they are not generating spurious products. This solution may require additional sampler power supply ports to accomplish the turn off and may reduce available intermediate frequency (IF) bandwidth due to loading.

In another similar technique to increase isolation, the LO power could be turned on and off to remove the LO from channels not in use. This would again prevent spurious signals from being generated in paths not being used. But this technique can be complicated since high power levels at high frequencies are often involved in the LO which cannot be readily switched on and off. There may also be the thermal-transient and power stability issues in trying to turn rapidly off and on LO power as would happen in a high-speed measurement system.

SUMMARY

According to embodiments of the present invention, a technique is provided to enhance the dynamic range of shockline-based sampling receivers without experiencing the generation of spurious responses and the reduction in channel-to-channel isolation as in previous systems.

The technique includes applying a bias voltage to the NLTL of each shocklines in a multi-channel system. The DC bias voltage applied to the NLTL provides direct control over the falling-edge shockline compression, and thus the insertion loss and overall RF bandwidth of the sampler. By measuring the shockline output and providing feedback, the bias voltage can be dynamically adjusted to alter the bandwidth of the NLTL sampling system and hence modify spurious generation and isolation behavior.

In one embodiment the bias voltage is selectable between a reverse-bias or negative voltage and a forward bias or positive voltage. The forward bias voltage is applied to turn off shocklines in channels that are not operating in order to reduce spurious generation and improve channel-to-channel isolation. In the limit of a strong forward or positive bias voltage, the incoming LO and its harmonics experience large ohmic losses along the shockline preventing gating pulses from forming. This accomplishes the same effect as turning off the sampler or the LO in one channel without the problems associated with prior-art approaches (i.e., transient problems are reduced and possible IF bandwidths are not affected). A reverse bias voltage is applied to turn on desired shocklines. In the reverse-bias or negative bias mode, the shockline diodes are typically in a reactive region, and falling edge compression can be reduced to improve overall performance.

In one embodiment in the reverse-bias operation mode, an automatic bias loop can be used to set the reverse or negative bias voltage level to restrict shockline operation to the reactive region of the shockline diodes and thus optimize conversion frequency. A processor, such as a DSP or an FPGA, can be connected to measure the output of the shockline sampler and provide a feedback signal to the bias circuit to assure the shockline is operating in its reactive region.

BRIEF DESCRIPTION OF THE DRAWINGS

Further details of the present invention are explained with the help of the attached drawings in which.

DETAILED DESCRIPTION

Figure 1:
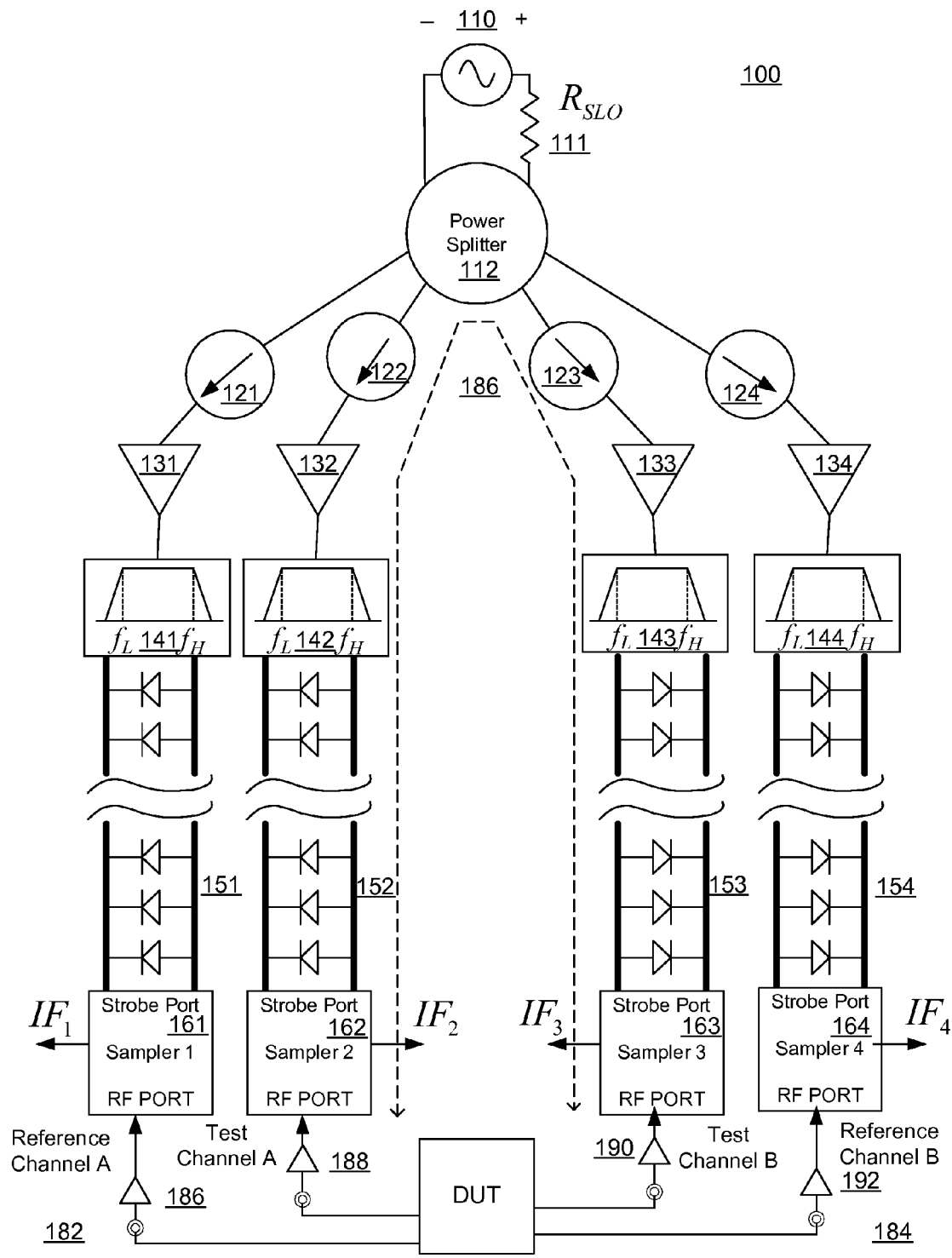
FIG. 1 shows an RF block of a prior art shockline-based sampling vector network analyzer.
Figure 2:
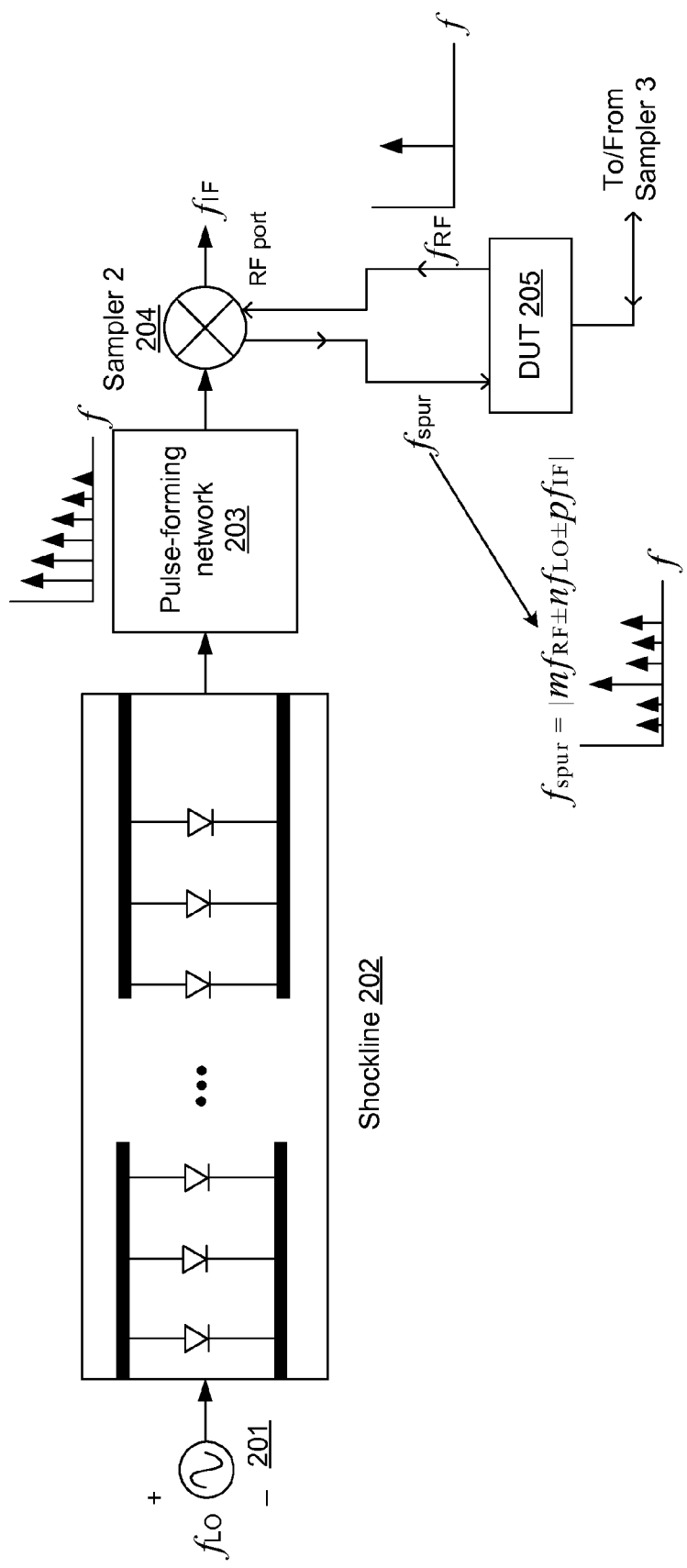
FIG. 2 shows an example of spurious signal generation.
Figure 3:
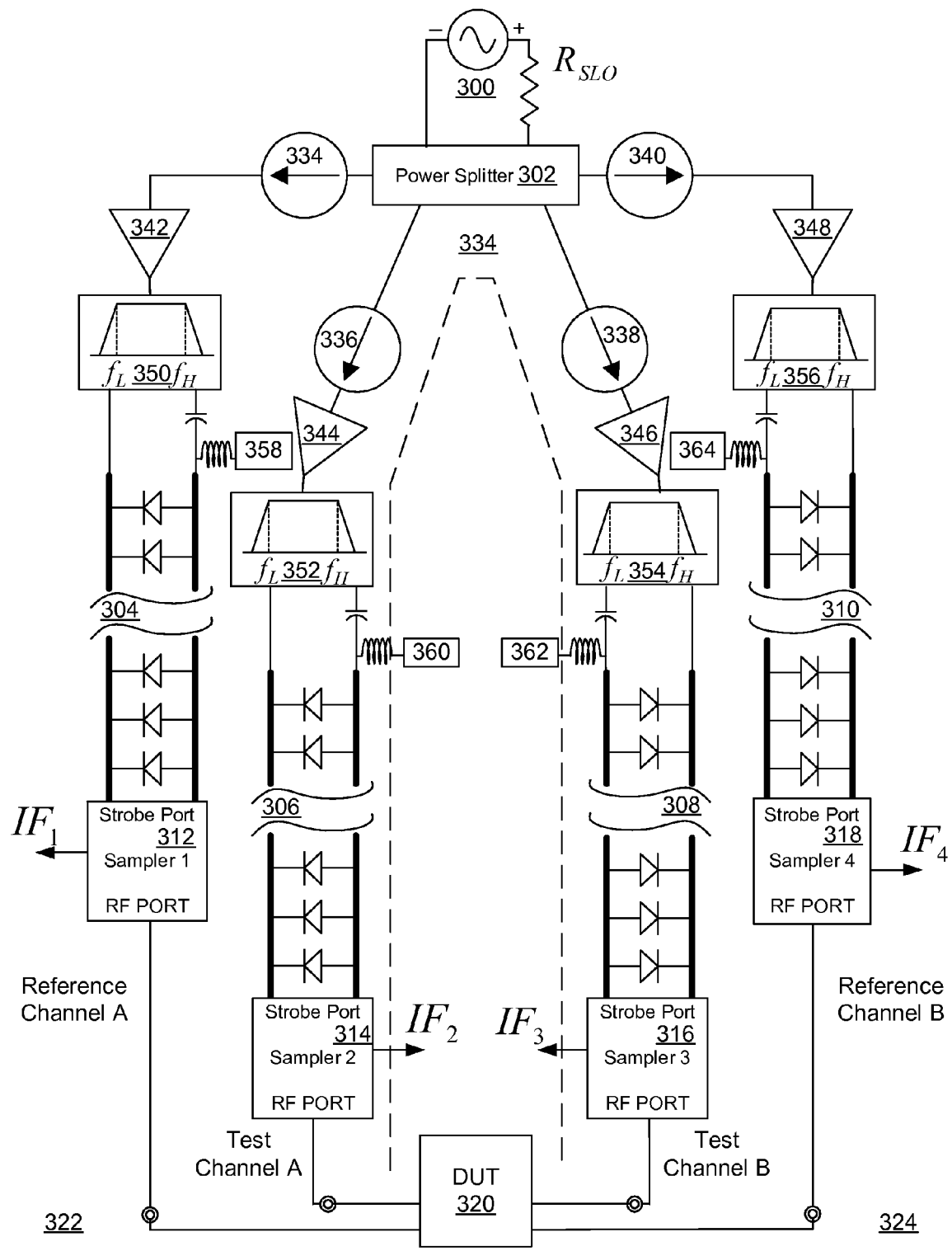
FIG. 3 shows a dynamically biased vector network analyzer in accordance with embodiments of the present invention.

FIG. 3 shows a vector network analyzer (VNA) with components included according to embodiments of the present invention. Source Generator 300 provides a source signal to power splitter 302. The power splitter splits the source signal into separate signals for driving test and reference channel samplers. Two test channels and two reference channels are utilized in the embodiment shown, but any number of channels may be used, depending on the design of the VNA. In each channel a nonlinear transmission line (NLTL), or shockline, receives the LO signal from the power splitter 302 and produces a pulse signal. The pulse signal is then used to gate a sampler 312-318.

Embodiments of the present invention in FIG. 3 include dynamic shock-line biasing circuit for enhancing the dynamic range of the sampling VNA. Each shockline is dynamically biased using a dynamic bias circuit 358-364. In one embodiment the bias voltage of the shockline is controlled to improve performance. The biasing circuitry controls the amount of falling-edge shockline compression and thus the gating aperture or RF bandwidth of the sampler.

A forward bias voltage can be applied in one embodiment to the biasing circuitry to effectively turn off unwanted channels without experiencing the effects of prior art systems. When strong forward bias is applied, the incoming LO and its harmonics may experience large ohmic losses along the shockline preventing gating pulses from forming. This provides a similar effect to turning off the sampler or the LO without the above mentioned problems associated with those methods, and results in enhanced channel-to-channel isolation and reduced spurious generation (which can affect dynamic range). Additionally, NLTL insertion loss is maximized in the presence of strong forward bias; this improves RF-to-LO isolation between channels. Also, spurious products appearing at the RF port of the sampler are suppressed.

When reverse bias is applied, the shockline is turned on to operate normally. By controlling the amount of shockline bias voltage, shockline operation can be restricted to the reactive region of the diodes, optimizing conversion efficiency. In one embodiment, an automatic bias loop may be used to restrict shockline operation to the reactive region of the diodes and thus optimize conversion efficiency. When operating in the reactive region, the fall time of the pulses produced by the shockline are minimized yielding the smallest pulse width, highest harmonic content, and widest sampler bandwidth.

At intermediate reverse-bias level settings, falling edge compression of the pulses produced by the shockline is reduced. This reduces the RF bandwidth of the sampler and reduces the harmonic content of the pulses which may lead to spurious signals. Additionally, NLTL insertion loss is increased, improving RF-to-LO isolation, and the generation of spurious products at the RF ports of the samplers is reduced. The bias level may be varied based on a feedback control signal. In one embodiment, a lookup table may be utilized by a controller to determine the appropriate bias level based on the control signal. In one embodiment, the bias level may be adjusted automatically by the controller based on other received signals, including harmonic and spurious signal levels fed back from the channel.

The control signal to the bias circuit can be received from a processing device such as a DSP or an FPGA. The processing device is connected to the shockline or sampler to measure its output and adjust bias level accordingly. The key abilities of the control signal and bias voltage system is to be able to source bipolar voltages (to get in all required regimes), accept control signals from a host to determine the required mode of operations, and, optionally, a current-sense capability for optimizing the reverse-bias mode and to prevent damage in the forward-bias modes. The bias can be adjusted automatically based on a received harmonic or spurious level output of the sampler. Relative to the prior art in improving dynamic range, the addition of dynamic shockline bias can reduce the number and complexity of isolation devices, and can thus lead to reduced system cost.

Controlling the edge allows a specific bandwidth differentiator in the pulse forming network that can further enhance channel-to-channel isolation. The ability to dynamically change the edge for different signals provides for even more versatility.

For operation of the VNA, concurrent to the generation of the pulse signal by the shockline for measuring a signal, a frequency sweeping RF signal is applied to the device under test (DUT) 320 to create the signal to be measured. In the embodiment shown, the frequency sweeping RF signal may be applied at ports 322, 324, or both. A DUT connected to one or more of the ports then creates a transmission signal or a reflected signal from the RF signal to be measured. The transmission signal or reflection signal is received by one of samplers 312-318. For example, for an RF signal applied to the DUT through port 322, the sampler 314 coupled to Test Channel A receives the DUT signal to be measured, while the sampler 316 coupled to Test Channel B receives another DUT signal. Each sampler used to measure the DUT signal is driven by the LO pulses generated from the shockwaves of the NLTLs 304-310. An intermediate frequency (IF) signal that carries the sampled data is then generated and transmitted from each sampler as $IF_1$, $IF_2$, $IF_3$ and $IF_4$ is illustrated in FIG. 3.

Due to RF-to-STROBE port coupling in typical samplers, a portion of the received signal power propagates through the sampler and associated non-linear transmission line, such as along path 334. Like systems of the prior art, VNAs incorporating embodiments of the present invention may include stages of isolation elements to minimize signal leakage between channels. These isolation elements may include amplifiers 342-348, isolators 334-340, and band pass filters 350-356. Additional isolation elements, such as amplifiers, may also be added in the RF path. Use of the isolation elements in conjunction with the dynamic shockline-biasing apparatus may, however, reduce the number and complexity of isolations elements needed in the VNAs to achieve sufficient isolation, unlike with prior art devices.

Figure 4:
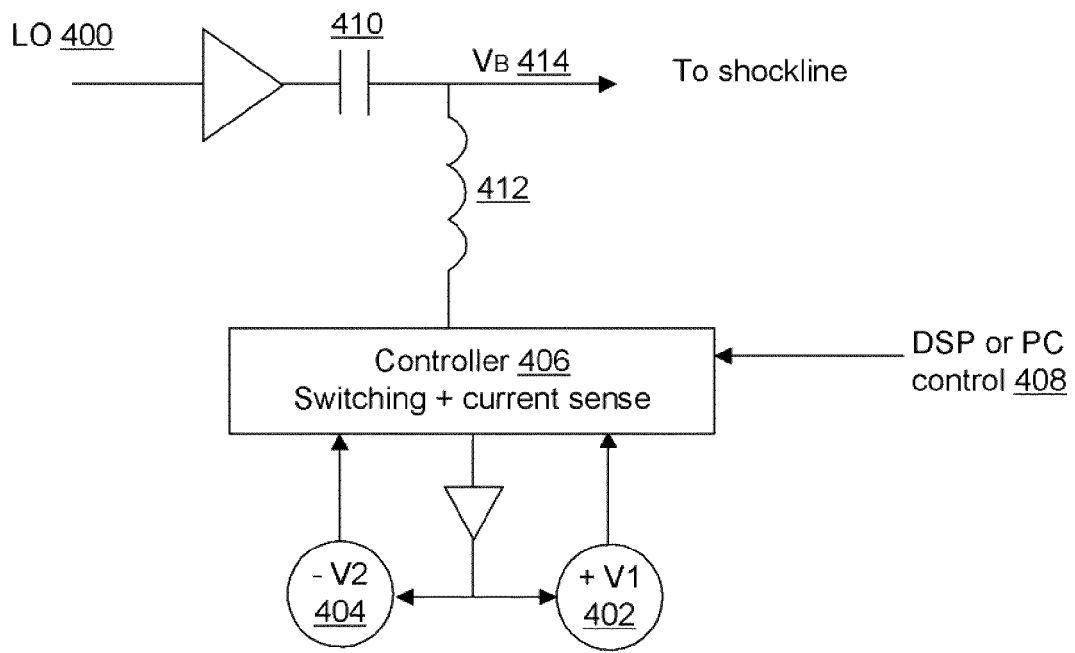
FIG. 4 shows a dynamic shockline-biasing apparatus in accordance with embodiments of the present invention.

FIG. 4 shows a dynamic shockline-biasing circuit in accordance with an embodiment of the present invention. A local oscillator (LO) input signal 400 is provided to a shockline. Bias voltage 414 is set by controller 406. Controller 406 can receive a control signal 308 from a digital signal processor (DSP) or other computer controller that measures the output of a shockline-based sampler. Controller 406 can select from voltage source 402, having a positive voltage, and voltage source 404, having a negative voltage. The negative voltage can further be varied by the controller 406 to produce the desired bias voltage 414 based on the control signal 408. In one embodiment, the shockline biasing circuit may include a capacitor or other direct current (DC) block 410 and an inductor or other alternating current (AC) choke 412. The controller may also include current-sense capabilities that enable the controller to limit the bias current to prevent damage to the shockline or to optimize reverse bias.

Figure 5:
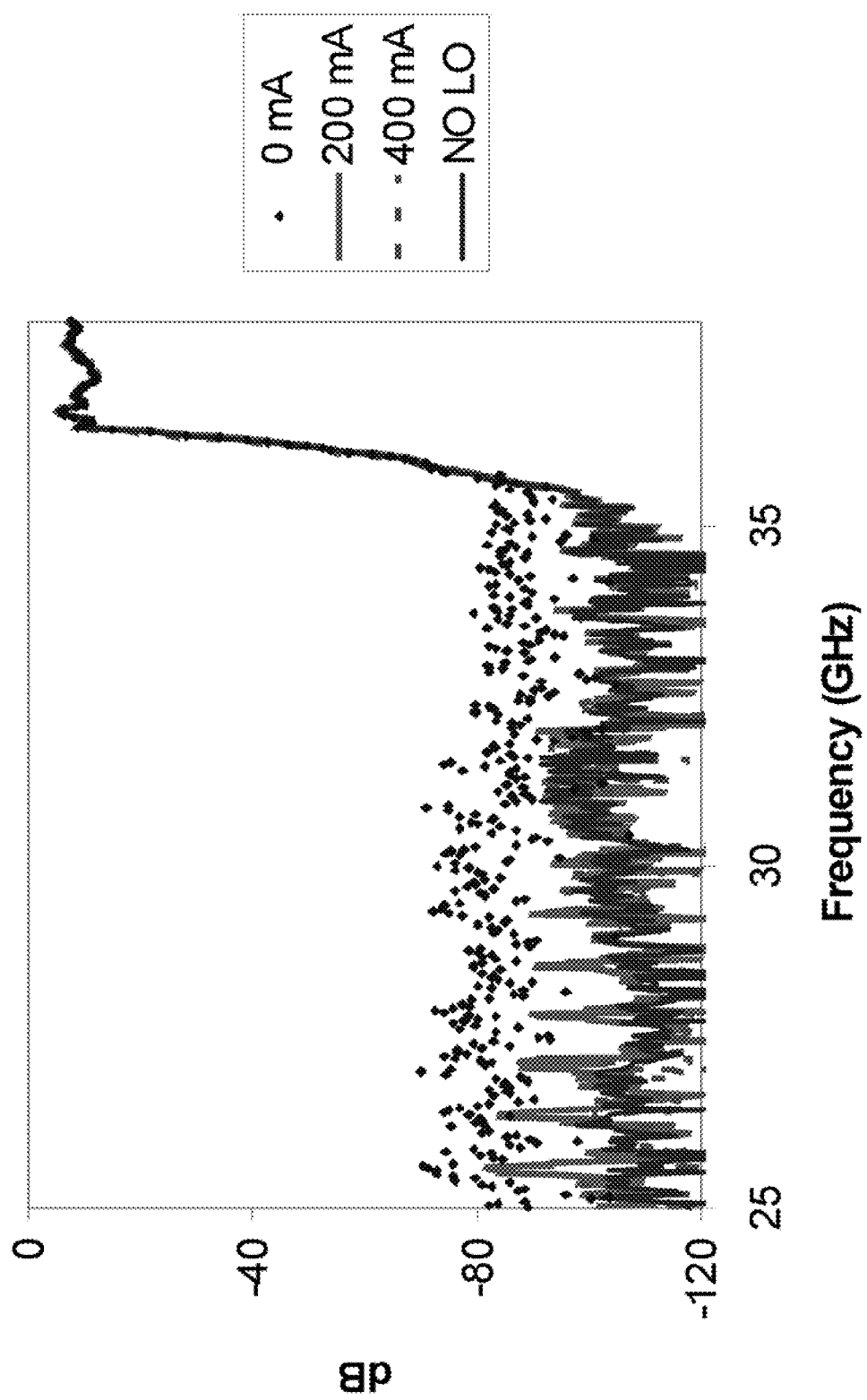
FIG. 5 shows exemplary measurements of a DUT at different shockline bias levels.

FIG. 5 shows exemplary measurements of a DUT at different shockline bias levels, with frequency plotted against transmission of a filter (the DUT) in dB. In the examples of FIG. 5, the shockline was operated with bias voltages applied during a series of transmission measurements to generate currents of 0 mA, 200 mA and 400 mA in the shockline. In a first case, no bias voltage was applied creating the 0 mA current shown. Without the bias voltage applied to cut off unused LO samplers, extra spurs were generated by the shockline leading to an elevated stop band measurement (near −70 dB in this case). As increased forward bias was applied (represented by the 200 mA and 400 mA plots) to cut off unused shocklines, the stop band response due to spurious signals decreased. At 200 mA, the resultant stopband response reaches the −80 dB level, while at most frequencies it was below −100 dB. At 400 mA, the entire stopband response dropped below −100 dB. The extra spurs, created in the absence of the bias voltage, passed through the passband of the DUT and converted to the measurement system IF leading to the degraded dynamic range at lower current levels. The forward bias technique worked by operating the shockline as a controllable low shunt impedance when a given channel was not used. Using a bias voltage generating as much as 400 mA in one embodiment increased the nominal isolation in one device from 40-50 dB to greater than 60 dB (10 GHz range), thus potentially removing the need for at least one isolation amplifier.

As the forward current of the shockline diodes increased in this scenario, the spurious-related problem decreased until the result was indistinguishable from the no-LO case that is further shown in FIG. 5. It turns out in one scenario a maximum forward current of 400 mA was all a shockline diode could handle. In such an embodiment, the controller could be used to limit the maximum forward current to 400 mA or less.

Although the present invention has been described above with particularity, this was merely to teach one of ordinary skill in the art how to make and use the invention. Many modifications will fall within the scope of the invention, as that scope is defined by the following claims.

What is claimed:

1. A method for increasing dynamic range of a vector network analyzer (VNA) receiver including multiple channels each having a shockline to generate pulses from a radio frequency (RF) signal transmitted over the shockline, the method comprising:
    applying a bias voltage to each shockline to compress a falling-edge of the RF signal; and
    adjusting, via a controller, the bias voltage of each shockline to adjust the falling-edge compression of the RF signal to vary a frequency bandwidth and insertion loss of each of the channels, thereby increasing the dynamic range of the VNA receiver.

2. The method of claim 1, wherein a forward bias voltage is applied to a given one of the shocklines in a channel not being used to turn off the given shockline and thus increase isolation between the channels, while a reverse bias voltage is applied to other ones of the shocklines in the channels turned on.

3. The method of claim 1, wherein the step of adjusting the bias voltage comprises applying a forward bias voltage to at least one of the shocklines to minimize spurious products provided at an RF port of a sampler connected to the at least one shocklines.

4. The method of claim 1, further comprising the step of:
   determining from feedback from an output of the shocklines an amount of reverse bias voltage to apply in the adjusting step.

5. A radio frequency (RF) sampling circuit comprising:
   a non-linear transmission line (NLTL) periodically loaded with varactor diodes and having an input configured to receive a local oscillator (LO) signal and generate pulses;
   a sampler connected to the output of the NLTL; and
   a bias circuit connected to apply a bias voltage to the NLTL to compress a falling-edge of the LO signal; and
   a controller to adjust the applied bias voltage;
   wherein adjusting the bias voltage applied to the NLTL adjusts the falling-edge compression of the LO signal to vary a frequency bandwidth and insertion loss of the RF sampling circuit, thereby increasing a dynamic range of the RF sampling circuit.

6. The RF sampling circuit of claim 5, wherein the NLTL comprises a high-impedance transmission line loaded periodically with the varactor diodes so as to form a propagation medium whose phase velocity and time delay are a function of instantaneous voltage on the transmission line.

7. The RF sampling circuit of claim 5, wherein the bias circuit comprises:
   a voltage source operable to produce a selectable bias voltage between a negative first voltage and a positive second voltage, the voltage source having a control input and an output providing a bias voltage to the NLTL; and
   a controller connected to the output of the sampler, the controller configured to select a bias voltage based on an output of the sampler and provide the bias voltage to the control input of the voltage source.

8. A Vector Network Analyzer (VNA) comprising:
   a local oscillator (LO) configured to generate a signal;
   a power splitter configured to distribute the signal to a plurality of outputs;
   a plurality of non-linear transmission line (NLTL) each periodically loaded with varactor diodes and having an input connected to one of the outputs of the power splitter, and each NLTL providing an output;
   a plurality of samplers each connected to the output of the NLTL;
   a bias circuit connected to each of the NLTLs to compress a falling edge of the distributed signal; and
   a controller connected to receive the output of each of the samplers and configured to determine a voltage level for each bias circuit to adjust the falling-edge compression of the distributed signal to vary insertion loss and bandwidth on each of the plurality of outputs, thereby increasing dynamic range of the VNA.

9. The VNA of claim 8, wherein the controller is further configured:
   to cause the bias circuits to apply a forward bias voltage to one of the samplers to be turned off to increase isolation between the channels; and
   to cause the bias circuits to apply a reverse bias voltage to one of the samplers to be turned on.

10. The VNA of claim 8, wherein the samplers include directional bridges comprising coupling arms that contain isolation devices for suppressing inter-modulation products.

11. The VNA of claim 8, wherein the power splitter includes isolating attenuators separating the channels.

12. The dynamic bias circuit of claim 8 wherein the controller is further operable to:
   detect a bias current; and
   limit the bias current based on a threshold value.

13. The dynamic bias circuit of claim 8 wherein the controller is further operable to:
   determine a reverse bias voltage to improve conversion efficiency of at least a given one of the NLTLs; and
   apply the reverse bias voltage to the given NLTL.

14. The method of claim 1, wherein adjusting the bias voltage of each shockline varies an amount of falling-edge shockline compression of the generated pulses.

15. The RF sampling circuit of claim 5, wherein adjusting the bias voltage applied to the NLTL varies an amount of falling-edge shockline compression of the generated pulses.

* * * * *